United States Patent [19]

Shiina

[11] 4,114,045

[45] Sep. 12, 1978

[54] OPTICAL CARD READER FOR SETTING FREQUENCY DIVISION RATIO OF PROGRAMMABLE COUNTER FOR USE IN SYNTHESIZER TUNERS

[75] Inventor: Fumio Shiina, Katsuta, Japan

[73] Assignee: Hitachi, Ltd., Japan

[21] Appl. No.: 763,083

[22] Filed: Jan. 27, 1977

[30] Foreign Application Priority Data

Jan. 30, 1976 [JP] Japan .................................. 51-8469
Oct. 8, 1976 [JP] Japan .............................. 51-120347

[51] Int. Cl.² ............................................. G06K 7/10
[52] U.S. Cl. .................................. 250/569; 235/458; 250/227
[58] Field of Search .............. 250/227, 555, 568, 569; 340/173 LM, 173 LS; 235/61.11 E

[56] References Cited

U.S. PATENT DOCUMENTS

3,065,356 11/1962 Blake et al. .......................... 250/569
3,937,972 2/1976 Snell .................................... 250/555

Primary Examiner—James B. Mullins
Attorney, Agent, or Firm—Craig & Antonelli

[57] ABSTRACT

In a scanning receiver set with a PLL frequency synthesizer, an optical card reader for presetting and memorizing a desired receiving channel is provided. Associated with $n$ light sources which are provided for $n$ channels and successively turned on or off under the control of a scanning control circuit are $n$ reflectors each having one incident surface and $m$ reflection surfaces. A beam of light from respective light sources incident to the incident surface is divided into $m$ reflected light fluxes, substantially parallel with each other, by the $m$ reflection surfaces. One of $m$ light receiving elements receives the $m$-th reflected light flux of the respective reflectors. Connected to each one of $m$ light receiving elements operable by the reflected light fluxes is a switching circuit which in turn is connected with a programmable counter. Inserted between the reflectors and the light receiving elements is a card having, in a matrix of $n$ columns and $m$ rows, holes which are possibly punched out for transmission or interruption of the reflected light fluxes from the reflectors to the light receiving elements. Operations of the light receiving elements and the switching circuits are controlled by the presence or absence of the holes so that $m$ binary codes are applied to the programmable counter to determine the frequency division ratio of the same.

5 Claims, 6 Drawing Figures

OPTICAL CARD READER FOR SETTING FREQUENCY DIVISION RATIO OF PROGRAMMABLE COUNTER FOR USE IN SYNTHESIZER TUNERS

BACKGROUND OF THE INVENTION

1. Field of the Invention

This invention relates to an optical card reader, for use in a scanning receiver set with a PLL (phase-locked loop) frequency synthesizer, which is applicable to a system utilizing an optical card for presetting and memorizing a desired receiving channel.

2. Description of the Prior Art

As PLL (phase-locked loop) systems become popular with development in integrated circuits, change has been taken place from a conventional quartz oscillator control system to a PLL frequency synthesizer control system for a scanning receiver set in which a plurality of desired receiving channels are presetting predeterminedly and a scanning operation is effected on the preset channels until the scanning reaches any preset channel tuned to an allocated electromagnetic wave at which the scanning is stopped for receiving the electromagnetic corresponding to the tuned channel. In the synthesizer control system, a unit is needed for presetting and memorizing the desired channels. Various types of memory unit are available including a switch memory type, semiconductor memory type and card memory type, of which the card memory type is the most simple in view of the manufacture cost and easiness of operation because data can be written in a card by simply punching out holes in case of a card without hole or by blocking holes in case of a card with holes and many channels can easily preset by simply exchanging cards.

Typically, a conventional PLL frequency synthesizer comprises a programmable counter the frequency division ratio of which is determined by detecting the presence or absence of holes of card of the memory unit, a reference oscillator, a phase detector for detecting the phase difference between a reference signal from the reference oscillator and an output from the programmable counter to convert it into a variation in voltage, a low-pass filter for integrating and smoothing an output voltage from the phase detector, and a voltage controlled oscillator the oscillation frequency of which is controlled by receiving a control voltage of an output from the filter. The output of the voltage controlled oscillator is used, for example, as a local oscillation frequency of a radio receiver set. Such a PLL frequency synthesizer is well known as being disclosed in U.S. Pat. No. 3,937,972, for example.

This invention contemplates an improvement in the memory unit or optical card reader. Conventionally, with a card having a memory section of $n$ channels and $m$ bits ($m$ and $n$ being integers more than one), for example 16 channels and 16 bits, $256 (= 16 \times 16)$ light emitting elements and $256 (= 16 \times 16)$ light receiving elements are needed, resulting an extremely expensive unit. Where a single light emitting element is used for illuminating 16 bit illumination zones of respective channels in consideration of reducing the number of light emitting elements, it is necessary to realize the light emitting element as a tungsten lamp or the like of high illumination, suffering from short lifetime, generation of heat and so on. Further, with a light receiving element of CdS, when the scanning time of the receiver is set to about 80 m sec. for one channel, it is necessary to read out data within 20 m sec., since it takes about 60 m sec. for locking the PLL circuit and detecting electromagnetic waves. Light response speed of the CdS light receiving element is insufficient for this purpose.

SUMMARY OF THE INVENTION

An object of this invention is to provide an inexpensive optical card reader reliability and life-time of which are improved.

Another object of this invention is to provide a card reader which is compact, easy to be assembled into blocks and easy to be incorporated into receiver sets.

To attain the above objects, according to this invention, contrivance is made to the light emitting element side preceding the card and the light receiving element side succeeding the card.

In the light emitting element side, for the purpose of attaining equivalency to $m$ light sources by using a single light source, there are provided a plurality of reflectors each having one incident surface and $m$ reflection surfaces corresponding to 1st. to $m$-th bits wherein a beam of light incident to the one incident surface is divided into $m$ reflected light fluxes which are substantially parallel with each other. The plurality of the reflectors which are the same in number as desired $n$ channels are prepared and arranged in line. In the light receiving element side, according to one embodiment in which the light receiving elements of CdS are used, $m$ strap CdS elements are prepared in place of individual CdS elements associated with respective ($n \times m$) bits of the memory plane and each arranged orthogonally with the respective reflectors, thereby the reflected light fluxes from the reflection surfaces of the same bit of respective channels being received by a single light receiving element. This arrangement reduces the number of CdS elements.

According to another embodiment of this invention, the light receiving element side is further improved wherein a condenser device comprising $m$ condenser plates each including $n$ reflection surfaces and one condenser surface is disposed orthogonally with the reflectors, $n$ beams of light incident to the condenser device which are substantially parallel with each other are reflected by the $n$ reflection surfaces to be focussed at one point on the condenser surface, and the focussed beam of light is detected by the light receiving element such as a phototransistor or photodiode opposed to the condenser surface of respective condenser plates.

With the improved constructions of this invention, the provision of the light emitting elements which are the same in number as the channel is sufficient and beam of light from the light source is steadily transmitted through the reflector, economizing the illumination intensity of light emitting element as compared to the conventional unit, so that it is possible to use low illumination light emitting element such as so-called LEDs and the like, thereby elongating the lifetime of unit and reducing manufacture cost. Further, the CdS light receiving elements are reduced in number to $m$ as compared to the conventional ($n \times m$) elements and when the condenser device on the basis of the same principle as the reflector is used, it is possible to use a phototransistor or photodiode as the light receiving element so that optical performances such as light response speed can be improved greatly, thereby improving reliability of the card reader.

DETAILED DESCRIPTION OF PREFERRED EMBODIMENTS

Figure 1:
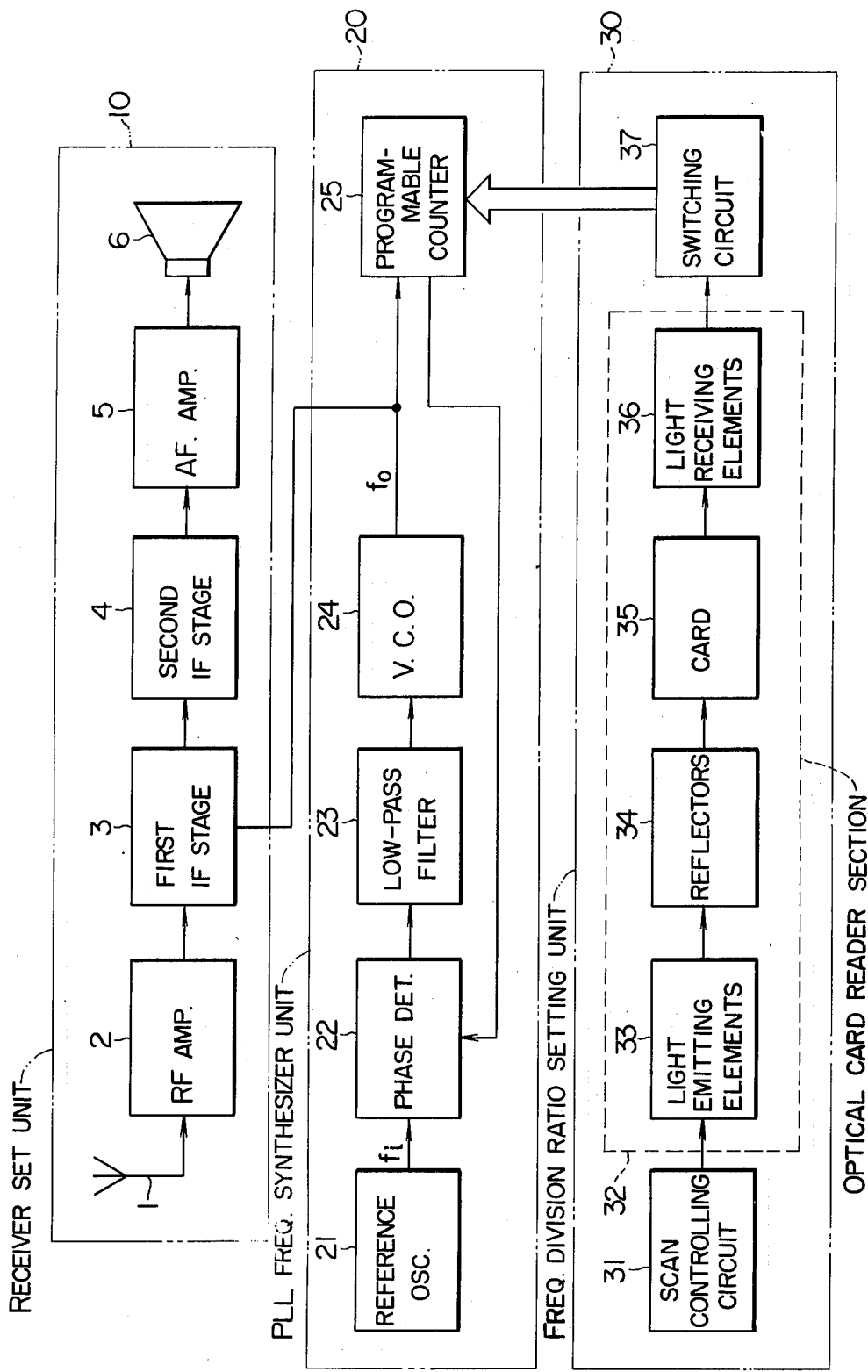
FIG. 1 is a block diagram of a scanning receiver set embodying this invention.

Referring now to FIG. 1, there is shown a block diagram of a scanning receiver, as an example of the present invention, comprising three principal units i.e., a receiver set unit 10, a PLL (phase-locked loop) frequency synthesizer unit 20 and a frequency division ratio setting unit 30 for a programmable counter 25 of the synthesizer unit 20. As well known, the receiver set unit 10 includes an antenna 1, an RF amplifier 2, a first IF stage 3, a second IF stage 4, an AF amplifier 5 and a loud-speaker 6. The PLL frequency synthesizer 20 includes a reference oscillator 21, a phase detector 22 for detecting the phase difference between a reference signal from the oscillator 21 and an output signal from the programmable counter 25 so as to convert it into the variation of voltage, and a low-pass filter 23 for integrating and smoothing an output voltage of the phase detector 22 thereby to supply a d.c. voltage to a voltage-controlled oscillator 24. The voltage-controlled oscillator 24 is an oscillator whose oscillation frequency is controlled by receiving the controlling voltage to deliver an output frequency $f_o$ to be used as, for example, a local oscillation frequency of the receiver set 10. The programmable counter 25 is capable of setting the frequency division ratio (N-value) to a desired integer by receiving binary codes at its plural input terminals $25_1, 25_2, \ldots, 25_m$. It is well known that $f_o = f_i \cdot N$ holds when the phase of the PLL is locked through a closed loop of from the phase detector 22 to the programmable counter 25 via the low-pass filter 23 and the voltage-controlled oscillator 24, where $f_i$ represents a reference frequency.

The frequency division ratio setting unit 30 serves to set the frequency division ratio of the programmable counter 25 and principally comprises a scan controlling circuit 31, an optical card reader section 32 and a group of switching circuits 37. The optical card reader section 32 includes a group of light emitting elements 33, a group of reflectors 34, a card 35 and a group of light receiving elements 36 and the present invention is incorporated into this card reader section 32, which will be detailed hereinafter by referring to FIG. 2.

Figure 2:
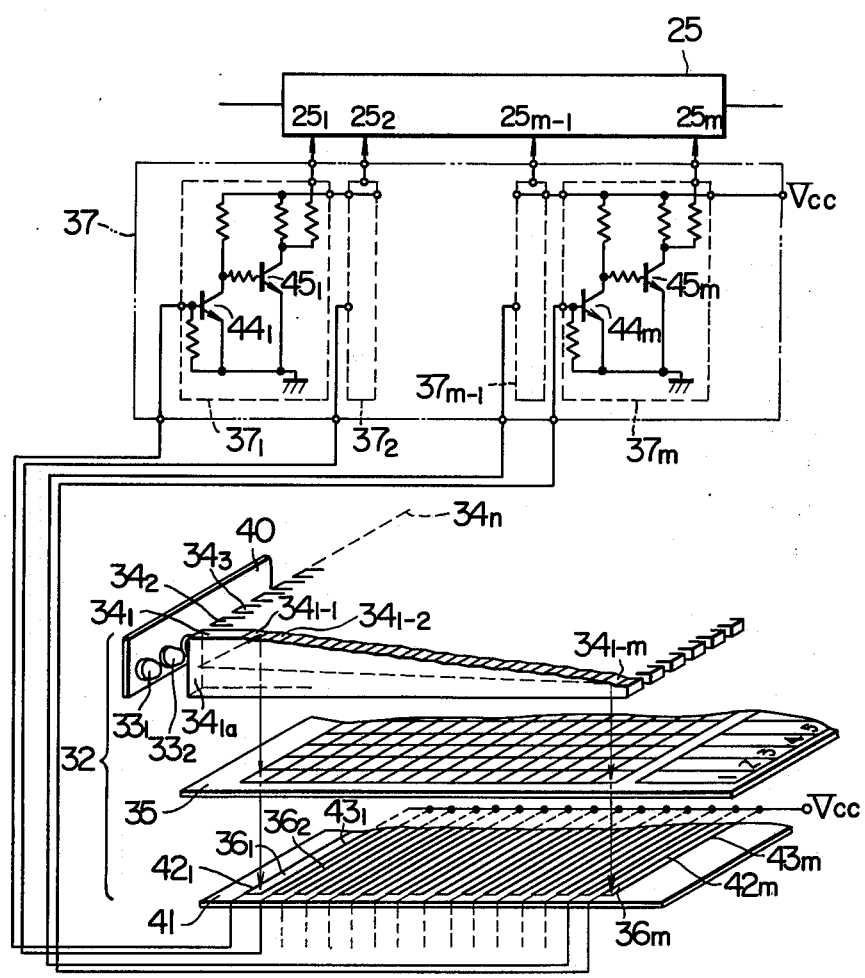
FIG. 2 is a diagrammatic representation partly showing an exploded perspective view of a card reader section of FIG. 1 and partly showing a circuit of a switching circuit embodying this invention.

In FIG. 2, one embodiment of the card reader section 32 is illustrated in an exploded perspective view and one embodiment of the group of switching circuits 37 is illustrated in a circuit diagram.

The light emitting elements $33_1, 33_2, \ldots$ amounting to the same number ($n$) as channel are prepared and mounted on a substratum 40. The scan control circuit 31 turns them on successively and repeatedly. The reflectors $34_1, 34_2, \ldots, 34_n$ made of a transparent material such as for example acryl resin or like material are arranged in parallel with each other to oppose corresponding light emitting elements. Each one of reflectors, for example reflector $34_1$ includes an incident surface $34_{1a}$ and $m$ gradually-stepped reflection surfaces $34_{1-1}, 34_{1-2}, \ldots, 34_{1-m}$ which divide a beam of light transmitting through the incident surface $34_{1a}$ into $m$ substantially parallel reflected light-beams. Numeral 41 represents a substratum provided with $m$ light receiving strap elements (of CdS, for example) $36_1, 36_2, \ldots, 36_m$ which are orthogonal with the reflectors $34_1, 34_2, \ldots 34_n$. Provided on both the longitudinal sides of respective light receiving elements are an electrode 42 connected to corresponding one of the switching circuits 37 and an electrode 43 connected to a power source terminal $V_{cc}$ so that the entirety of the light receiving elements draws a stripe pattern. The group of switching circuits 37 includes switching circuits $37_1, 37_2, \ldots, 37_m$. Each one of the switching circuits principally includes two transistors 44 and 45, for example, wherein the transistor 44 has its base connected to the electrode 42 and the transistor 45 has its collector connected to corresponding one of the input terminals of the programmable counter 25. Accordingly, when taking the light emitting element $33_1$, for example, the operation of the arrangement covering the group of light emitting elements 33 and the group of switching circuits 37 will be described as below. When the light emitting elements $33_1$ is turned on to emit a beam of light which is incident to the incident surface $34_{1a}$ and then reflected by the reflection surface $34_{1-1}$ of the reflector $34_1$, the beam of light decreases the resistance of the light receiving element $36_1$ (CdS) so that the switching circuit $37_1$ is controlled such that a transistor $44_1$ is turned on and a transistor $45_1$ is turned off, delivering a binary code "0" to the input terminal $25_1$ of the programmable counter 25. Since the card has holes, in a matrix form of $m$ columns and $n$ rows, to be possibly punched out and respective light receiving elements $36_1$ to $36_m$ are associated with corresponding one of the $m$ columns whereas respective reflectors $34_1$ to $34_n$ are associated with corresponding one of the $n$ rows, some of the beams of light reflected by the group of reflectors 34 transmit through the card and the others are interrupted thereby. In consequence, some of the input terminals of the programmable counter 25 are supplied with binary codes "0" and the others are supplied with binary codes "1," thereby setting a desired frequency division ratio. Accordingly, when the light emitting elements $33_1, 33_2, \ldots, 33_n$ are successively turned on at a desired period, for example 80 m sec., the group of switching circuits 37 is controlled and the frequency division ratio of the programmable counter 25 is determined by detecting the presence or absence of the holes provided for the card 35 in order to control the local oscillation frequency of the scanning receiver set.

Figure 3:
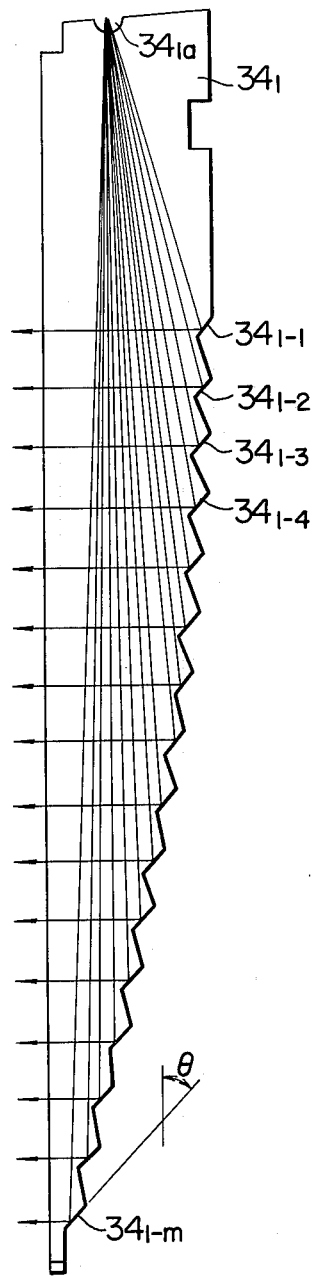
FIG. 3 is an enlarged side view of a reflector shown in FIG. 2.

FIG. 3 is an enlarged side view of one of the reflectors 34 such as reflector $34_1$ when $m = 16$. An incident beam of light transmitting through the incident surface $34_{1a}$ is divided into 16 parallel light fluxes by the reflection surfaces $34_{1-1}, 34_{1-2}, \ldots, 34_{1-16}$, where an angle $\theta$ characteristic to the respective reflection surfaces is determined through design of the position of the incident surface, the length and height of the reflector and the like. Where the reflector is made of acryl resin and the light emitting element is a so-called LED, the critical angle $i_c$ for total reflection at the inner surface of the acryl resin reflector is determined as, $$i_c = \sin^{-1}\frac{1}{n} (°) \approx 42°$$

by using the refractive index $n$ of acryl resin which is equal to 1.49 when the wave length λ of red light of the LED is 6600 A. Among the above-mentioned reflection surfaces, any reflection surfaces having an angle θ larger than the critical angle may be deposited with aluminum to ensure the total reflection.

Figure 4:
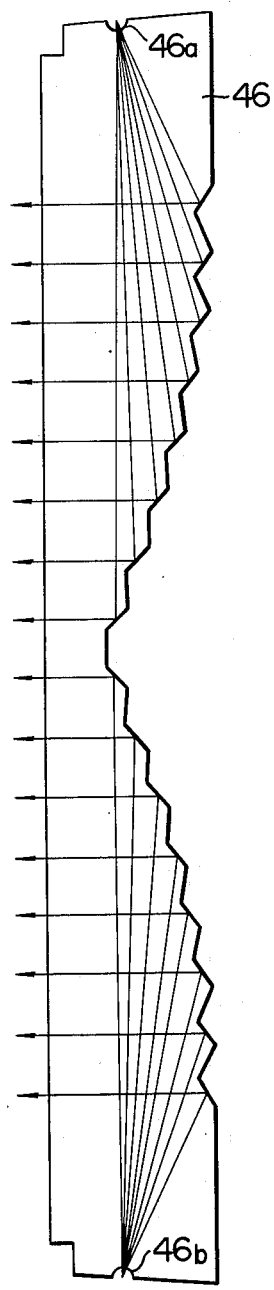
FIG. 4 is an enlarged side view of another embodiment of reflector.

FIG. 4 shows a side view of another embodiment of reflector wherein a single reflector 46 is associated with two light emitting elements. When the two light emitting elements respectively opposed to incident surfaces 46a and 46b of the reflector 46 are turned on simultaneously, the same effect as the reflector of FIG. 3 is accomplished. Further, if the two light emitting elements are turned on for independent channels, memory capacity per one channel is decreased but advantage results therefrom that the number of channel is doubled or the number of reflectors is halved.

Figure 5:
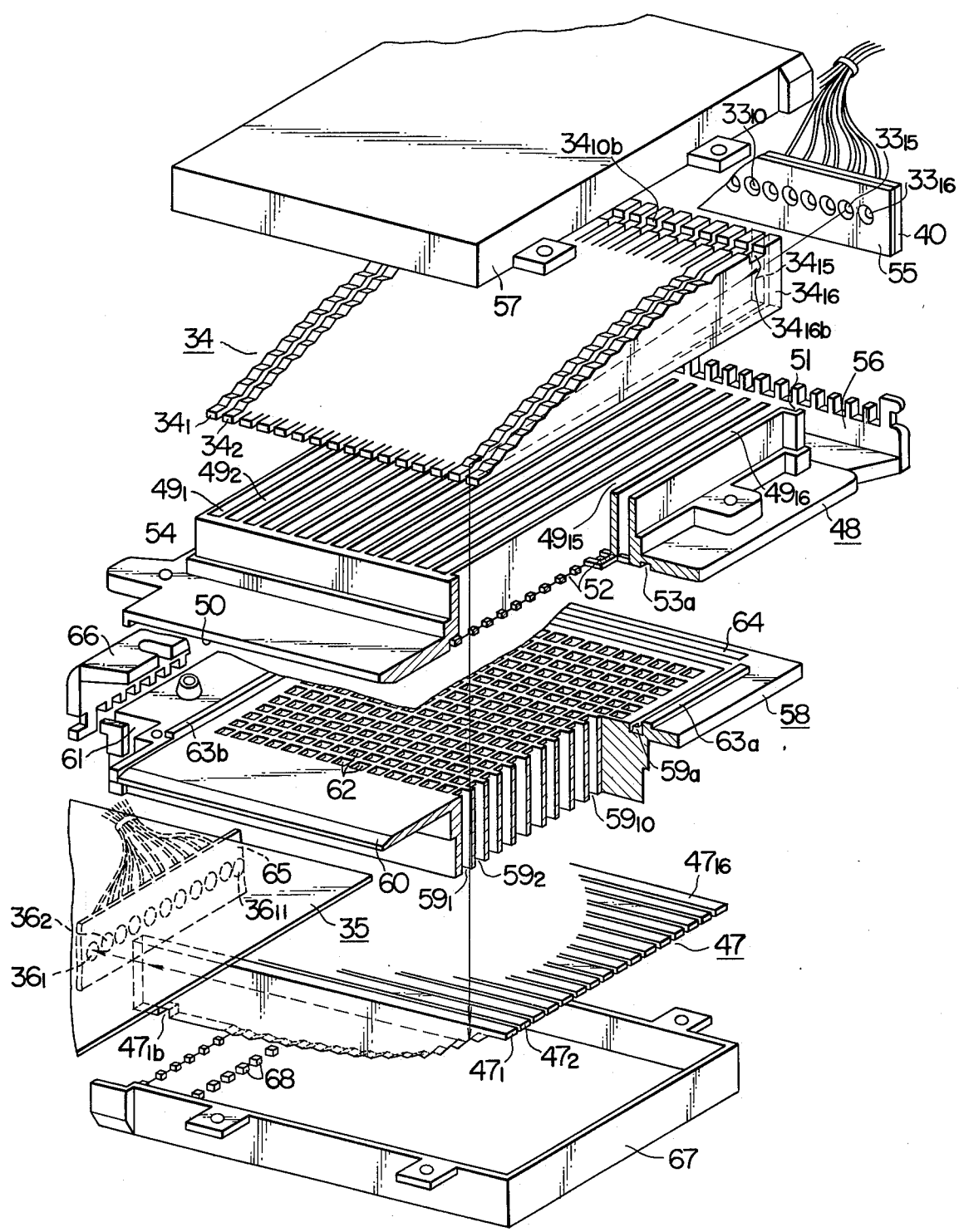
FIG. 5 is an exploded perspective view of another embodiment of card reader section.

FIG. 5 shows an exploded perspective view of an improvement of the foregoing optical card reader section 32 wherein a condenser device 47 constructed on the basis of the same principle as the reflector 34 is added between the card 35 and the group of light receiving elements 36 shown in FIG. 1. With reference to FIG. 5, a card reader with 16 channels and memory capacity of 16 bits will be described hereunder.

As diagrammatically shown in the figure, a casing 48 provided with 16 channels $49_1, 49_2, \ldots, 49_{16}$ for accommodating 16 reflectors $34_1, 34_2, \ldots, 34_{16}$ includes an inlet 50, communicated with the front of casing, into which the card 35 is slid, posts 51 against which a base plate 40 mounted, on its rear surface, with 16 light emitting elements $33_1, 33_2, \ldots, 33_{16}$ abuts, and 256 holes 52 formed in areas on the bottom of the casing by partitioning the respective channels by means of 16 (= $m$) bridges. Applied on the front surface of the base plate 40 is a black cloth 55 for preventing interactions with the reflectors 34 and leakage of light. A member designated at 56 is a pad for the base plate 40 and numeral 57 designates a top lid. A casing 58 provided with 16 channels $59_1, 59_2, \ldots, 59_{16}$ for accommodating 16 condenser plates $47_1, 47_2, \ldots, 47_{16}$ includes an inlet 60, communicated with the front of the casing, into which the card 35 is slid, posts 61 against which a base plate 65 mounted, on its left side surface, with 16 light receiving elements (phototransistors) $36_1, 36_2, \ldots, 36_{16}$ abuts, and 256 holes formed in the top of the casing. The reflector casing 48 is stacked on the condenser casing 58 in line with each other by means of embossments 63a 63b and a groove 64 of the condenser casing 58 and grooves 53a and 53b (not shown) and an embossment (not shown) of the reflector casing 48. A member designated at 66 is a pad for the base plate 65 and numeral 67 designates a bottom lid.

The card reader thus constituted is assembled in the following order. Firstly, 16 reflectors $34_1, 34_2, \ldots, 34_{16}$ are inserted into the corresponding channels $49_1, 49_2, \ldots, 49_{16}$ of the reflector casing 48 until tips of the reflectors abut bosses 49a when fully inserted. Thereafter, the base plate 40 is brought into engagement with the rear surface (incident surface) of the reflector 34 and it is held in placed fixedly by means of the pad member 56 and the top lid 57. The pad member 56 and the top lid 57 are secured to the reflector casing 48 independently with screws. It should be understood that the reflector 34 is positively positioned by the engagement of an embossment (not shown) of the top lid 57 with recesses $34_{1b}, 34_{2b}, \ldots, 34_{16b}$. In a similar manner, 16 condenser plates $47_1, 47_2, \ldots, 47_{16}$ are inserted into the corresponding channels $59_1, 59_2, \ldots, 59_{16}$ of the condenser casing 58 until tips of the condenser plates abut a boss 59a when fully inserted. Thereafter, the base plate 65 is brought into engagement with the left side surface (condenser surface) of the condenser device 47 and it is held in place fixedly by means of the pad member 66 and the bottom lid 67. The pad member 66 and the bottom lid 67 are secured to the condenser casing 58 independently with screws. The condenser device 47 and the bottom lid 67 are positively put together by the engagement of embossments 68 of the bottom lid 67 with the channels $47_{1b}, 47_{2b}, \ldots, 47_{16b}$. The card 35 may be slid through the inlets 50 and 60.

Figure 6:
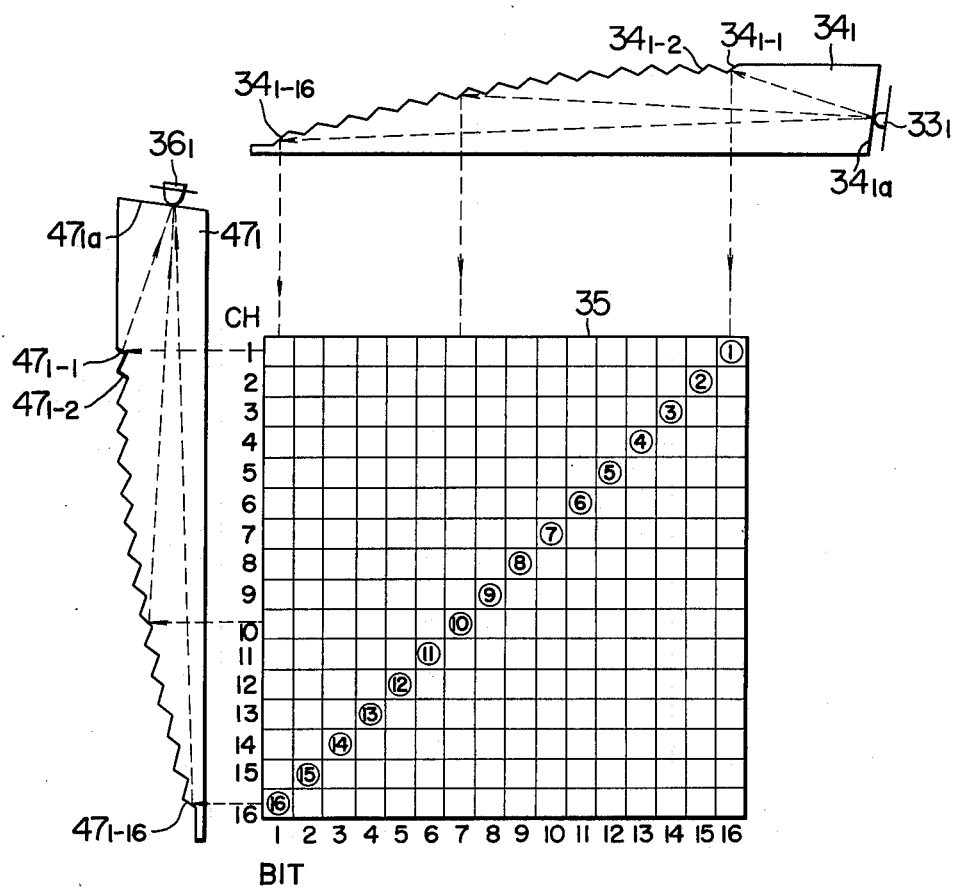
FIG. 6 is an explanatory diagrammatical representation of light path.

Turning now to FIG. 6 showing an explanatory diagrammatical representation of FIG. 5, the construction of the condenser device 47 and light paths in the card reader will be described.

As has been described hereinbefore, each one of the reflectors, for example the reflector $34_1$, has one incident surface $34_{1a}$ and $m$ (= 16) reflection surfaces. Where the number $n$ of channels and the number $m$ of reflection surfaces are equal, the condenser plate $47_1$ has the same construction as the reflector $34_1$ as shown in FIGS. 5 and 6. In this case, the incident surface of the condenser may be referred to as the condenser surface. More particularly, an incident beam of light from the light emitting element $33_1$ is divided by the 16 reflection surfaces into 16 light fluxes which reach 1st. to 16th bit holes formed within the first channel $CH_1$. As a whole, the reflectors $34_1$ to $34_{16}$ are associated with corresponding channels so that the 256 holes 52 of the reflector casing 48 of FIG. 5 are scanned with the light fluxes successively and repeatedly from channels $CH_1$ to $CH_{16}$. Then, the parallel light fluxes admitted to the condenser device 47 through the card 35 and the 256 holes of the condenser casing 58 are reflected by the 16 reflection surfaces of the respective condenser plates such that the beam of light transmitting the first bit hole of the respective channels is focussed on one point of a focal surface $47_{1a}$ dependent on information as to whether or not the beams of light are transmissible through the first bit holes of the channels. The beam of light once focussed at the focal surface $47_{1a}$ is detected by an associated light receiving element $36_1$. That is to say, the light receiving element $36_1$ detects, on the time division base, an information of the first bit of the channel $CH_1$ when the channel $CH_1$ is illuminated and an information of the first bit of the channel $CH_2$ when the channel $CH_2$ is illuminated. This relation holds true between other bits of respective channels and associated light receiving elements.

Consequently, the condenser device of FIG. 5 permits the application of phototransistors or photodiodes in place of the light receiving elements of CdS, eliminating the problem of slow light response speed inherent to the CdS element. More specifically, when the scanning time of the scanning receiver set is set to about 80 m sec. for one channel, it is necessary to read out data on the card within 20 m sec. since it takes about 60 m sec. for locking the PLL circuit and detecting electromagnetic waves. The CdS light receiving element having slow light response speed is defective for this purpose. With the card reader of FIG. 5, however, the light receiving element can be realized by phototransistors or photodiodes having rapid light response speed.

I claim:

1. An optical card reader comprising $n$ light emitting elements being successively turned on at a constant scanning rate by a scan control circuit;
   $n$ reflectors each having one incident surface formed on a side thereof and $m$ gradually-stepped reflection surfaces associated with the respective light emitting elements for receiving a beam of light from the respective light emitting element through the incident surface and dividing by the reflection surface the beam into $m$ reflected light fluxes which are substantially parallel with each other;
   a card slidably removable with respect to the $n$ reflectors and having programmable holes such that ($n \times m$) reflected light fluxes from the reflectors are transmitted through the card or interrupted thereby;
   $m$ light receiving elements disposed orthogonally with the reflectors for receiving in common reflected light fluxes which are reflected at the reflection surfaces at the same order of all the reflectors and transmitted through the card; and
   $m$ switching circuits operable to produce binary codes by the operation of the respective light receiving elements,
   wherein the frequency division ratio of a programmable counter is determined by receiving the binary codes from the switching circuits.

2. An optical card reader according to claim 1, wherein the respective reflectors comprise two opposed incident surfaces and the same number of reflection surfaces on opposite sides gradually shallowed toward the intermediate portion of the opposed incident surfaces, whereby beams of light incident to both the incident surfaces are reflected by the reflection surfaces in substantially parallel relationship with each other toward one side of the respective reflectors.

3. An optical card reader comprising $n$ light emitting elements being successively turned on at a constant scanning rate by an scan control circuit;
   $n$ reflectors each having one incident surface and $m$ reflection surfaces associated with the respective light emitting elements for receiving a beam of light from the respective light emitting element through the incident surface and dividing by the reflection surface the beam into $m$ reflected light fluxes which are substantially parallel with each other;
   a card slidably removable with respect to the $n$ reflectors and having programmable holes such that ($n \times m$) reflected light fluxes from the reflectors are transmitted through the card or interrupted thereby;
   a condenser device having $m$ condenser plates disposed to receive reflected light fluxes which are reflected at the reflection surfaces at the same order of all the reflectors and transmitted through the card;
   $m$ light receiving elements each associated with the respective condenser plates; and
   $m$ switching circuits each associated with the respective light receiving elements and operable to produce independent binary codes by the operation of the respective light receiving elements,
   whereby the frequency division ratio of a programmable counter is determined by receiving the binary codes from the switching circuits.

4. An optical card reader comprising $2n$ light emitting elements being successively turned on at a constant scanning rate by a scan control circuit;
   $n$ reflectors each having two opposed incident surfaces and $m$ reflection surfaces of which two halves are opposed to said incident surfaces respectively associated with the respective light emitting elements for receiving a beam of light from the respective light emitting element through the incident surfaces and dividing by the reflection surfaces the beam into $m$ reflected light fluxes which are substantially parallel with each other;
   a card slidably removable with respect to the $n$ reflectors and having programmable holes such that ($n \times m$) reflected light fluxes from the reflectors are transmitted through the card or interrupted thereby;
   $m$ light receiving elements disposed orthogonally with the reflectors for receiving in common reflected light fluxes which are reflected at the reflection surfaces at the same order of all the reflectors and transmitted through the card; and
   $m$ switching circuits operable to produce binary codes by the operation of the respective light receiving elements,
   whereby the frequency division ratio of a programmable counter is determined by receiving the binary codes from the switching circuits.

5. An optical card reader for reading existence of holes programmably provided in $n$ line by $m$ columns hole positions wherein $n$ and $m$ are both an integer greater than 1 comprising:
   $n$ light emitting elements successively turned on one after another at a constant scanning rate;
   $n$ reflectors each having at least one incident surface and $m$ reflection surfaces, light emitted by each of said light emitting elements being supplied to the associated incident surface of each of said reflectors, respectively, so as to be delivered to the $m$ reflection surfaces, said $m$ reflection surfaces of each of said reflectors having such respective inclination angles depending on distances from the incident surface that the light is reflected by the respective reflection surfaces to form $m$ reflected light fluxes which are substantially parallel with each other and position in one line, said $n$ reflectors being arranged in parallel to provide a reflected light flux matrix of $n$ lines by $m$ columns;
   $m$ light receiving elements disposed orthogonally with the reflectors and arranged in parallel to each other, each of said receiving elements operatingly receiving in common the $n$ reflected light fluxes which are reflexed one after another at the reflection surfaces at same order of all the $n$ reflectors and which represent informations of existence and non-existence of holes at $n$ hole positions in one line therewith of said card, so that the respective light receiving elements receive the information of $m$ hole positions of one column after another;
   $m$ switching circuits connected to the respective light receiving elements for operatingly producing binary code signals in response to the informations received by the light receiving elements.

* * * * *